(12) United States Patent
Eppich (10) Patent No.: US 11,264,320 B1
(45) Date of Patent: Mar. 1, 2022

(54) INTEGRATED ASSEMBLIES

(71) Applicant: Micron Technology, Inc., Boise, ID (US)

(72) Inventor: Anton P. Eppich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/090,764

(22) Filed: Nov. 5, 2020

(51) Int. Cl.
| | |
|---|---|
| *H01L 23/522* | (2006.01) |
| *H01L 27/108* | (2006.01) |
| *G11C 11/4091* | (2006.01) |
| *G11C 11/408* | (2006.01) |
| *G11C 11/4097* | (2006.01) |
| *G11C 11/4099* | (2006.01) |

(52) U.S. Cl.
CPC ...... *H01L 23/5225* (2013.01); *G11C 11/4091* (2013.01); *H01L 27/10808* (2013.01); *G11C 11/4085* (2013.01); *G11C 11/4097* (2013.01); *G11C 11/4099* (2013.01)

(58) Field of Classification Search
CPC .......... H01L 23/5225; H01L 27/10808; G11C 11/4091; G11C 11/4085; G11C 11/4099; G11C 11/4097
See application file for complete search history.

(56) References Cited

U.S. PATENT DOCUMENTS

| 5,177,027 A | 1/1993 | Lowrey et al. |
| 7,446,372 B2 * | 11/2008 | Forbes .................. G11C 11/405 257/296 |

OTHER PUBLICATIONS

Hidaka et al., "Twisted Bit-Line Architectures for Multi-Megabit DRAMS's", IEEE Journal of Solid-State Circuits, vol. 24, No. 1, Feb. 1989, United States, pp. 21-27.

* cited by examiner

*Primary Examiner* — James G Norman
(74) *Attorney, Agent, or Firm* — Wells St. John P.S.

(57) ABSTRACT

Some embodiments include an integrated assembly having a set of true digit-lines and a set of complementary digit-lines. Each of the complementary digit-lines is comparatively coupled with an associated one of the true digit-lines. A semiconductor substrate is under the true digit-lines. The semiconductor substrate includes semiconductor features which project upwardly from a semiconductor base and which extend along a first direction. Each of the semiconductor features has opposing sidewalls. First source/drain regions are within the semiconductor features and second source/drain regions are within the semiconductor base. The true digit-lines are coupled with the first source/drain regions. Wordlines are along the opposing sidewalls and include gating regions which gatedly couple the first source/drain regions with the second source/drain regions. Storage-elements are coupled with the second source/drain regions. In some embodiments, memory may utilize a $4F^2$ layout.

32 Claims, 5 Drawing Sheets

FIG. 7 (Folded Architecture)

FIG. 8 (Open Architecture - 1)

FIG. 9 (Open Architecture-2)

INTEGRATED ASSEMBLIES

TECHNICAL FIELD

Memory arrays (e.g., DRAM arrays). Integrated assemblies comprising vertically-stacked decks.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

Figure 1:
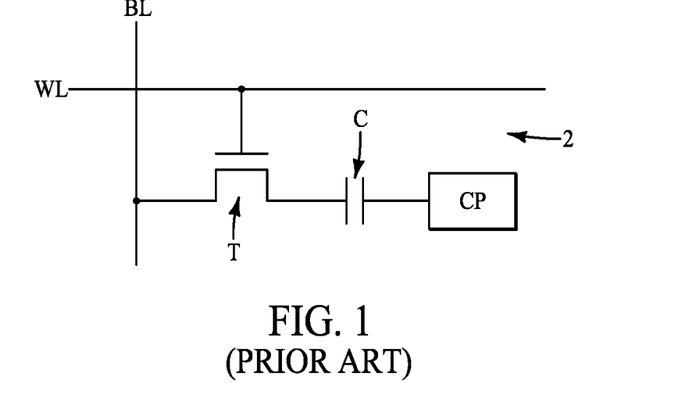
FIG. 1 is a schematic diagram of a prior art memory cell having one transistor and one capacitor.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line, routing line, first linear structure, etc.), and has a source/drain region coupled to a bitline BL (i.e., digit-line, sense line, second linear structure, etc.). In operation, an electric field generated by voltage along the wordline may gatedly couple the bitline to the capacitor during read/write operations.

Figure 2:
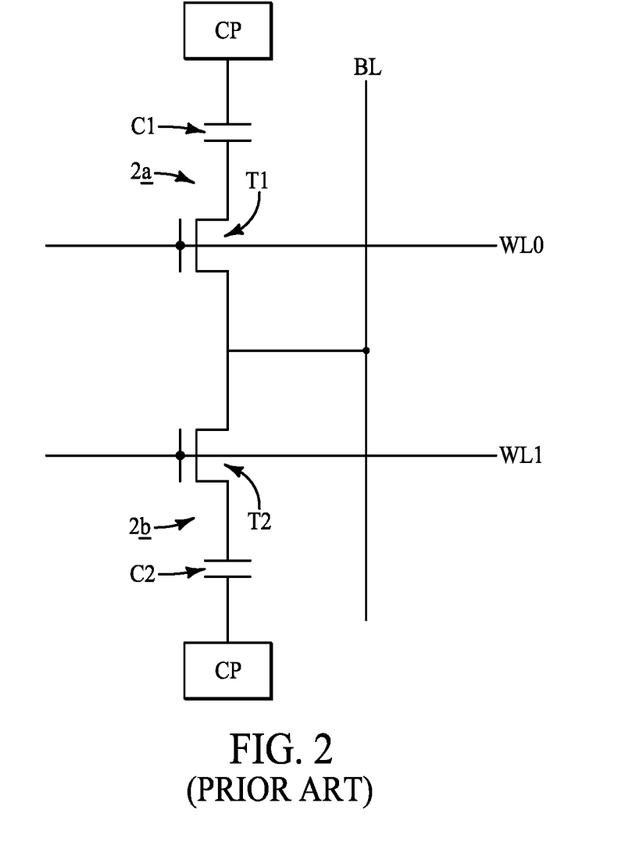
FIG. 2 is a schematic diagram of a pair of prior art memory cells which each have 1 transistor and 1 capacitor, and which share a bitline connection.

Another prior art 1T-1C memory cell configuration is shown in FIG. 2. The configuration of FIG. 2 shows two memory cells 2a and 2b, with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

Figure 3:
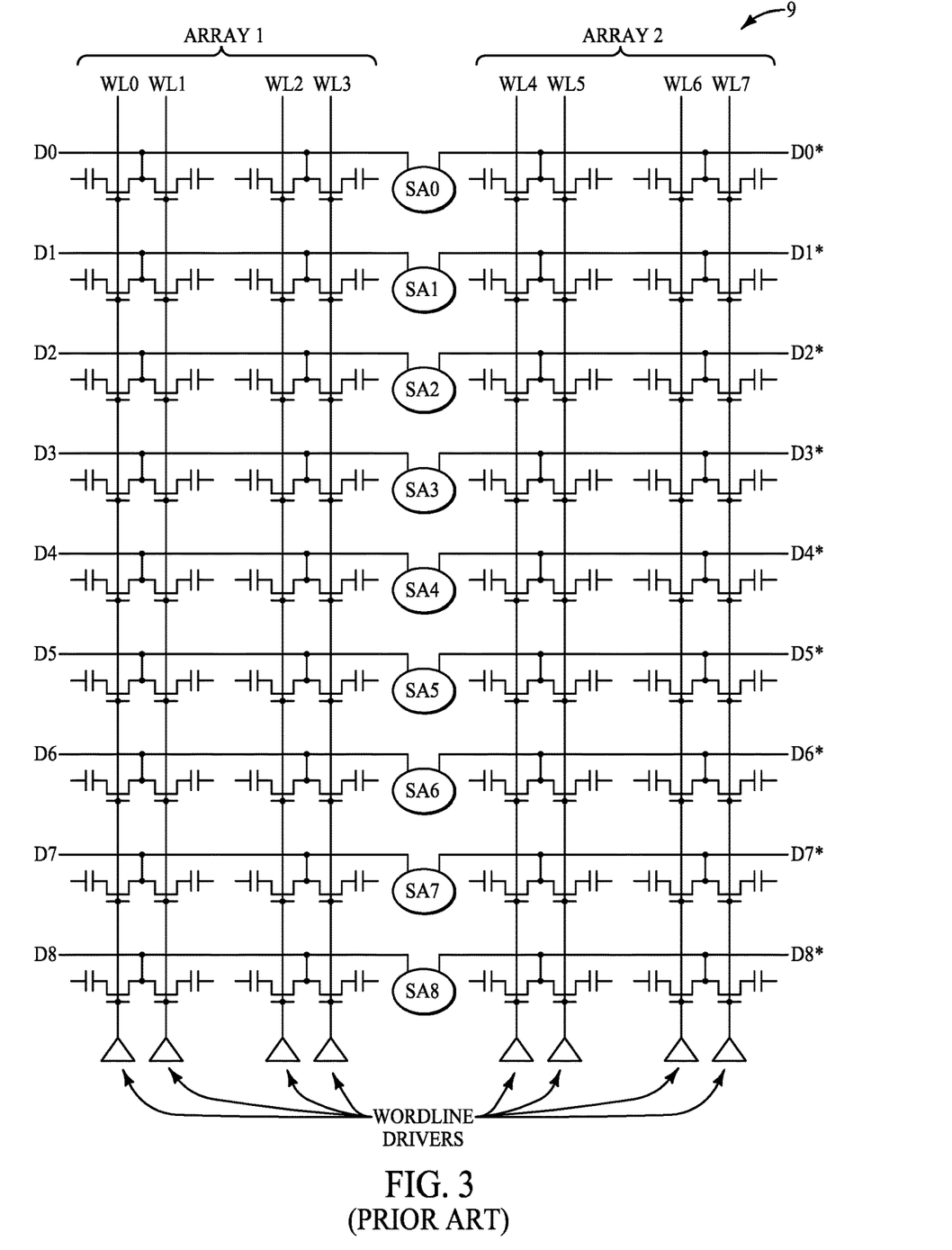
FIG. 3 is a schematic diagram of a prior art integrated assembly having open bitline architecture.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 in order to simplify the drawing). Wordlines WL0-WL7 extend across the arrays, and are coupled with wordline drivers. Digit-lines D0-D8 are associated with the first array (ARRAY-1), and digit-lines D0*-D8* are associated with the second array (ARRAY-2). Sense amplifiers SA0-SA8 are provided between the first and second arrays. Digit-lines at the same height are paired within one another and compared through a sense amplifier (e.g., digit-lines D0 and D0* are paired with one another and compared with the sense amplifier SA0). In a read operation, one of the paired digit-lines may serve as a reference in determining electrical properties (e.g., voltage) of the other of the paired digit-lines.

Performance of memory may be degraded by cross-talk between neighboring digit-lines. It is desired to develop new memory architectures which can reduce the cross-talk between neighboring digit-lines. It is further desired for the new memory architectures to have a small footprint in order to conserve valuable semiconductor real estate.

DETAILED DESCRIPTION OF THE ILLUSTRATED EMBODIMENTS

Some embodiments include integrated assemblies having true and complementary digit-lines which are comparatively coupled to one another through sense-amplifier-circuitry. The digit-lines may be over linearly-extending semiconductor features, and may be coupled to source/drain regions within such features. In some embodiments, the complementary digit-lines may be coupled with a reference-voltage-source and may provide shielding between the true digit-lines in folded architecture. In other embodiments, the complementary digit-lines may be laterally spaced from the true digit-lines in open architecture. Example embodiments are described with reference to FIGS. 4-9.

Figure 4:
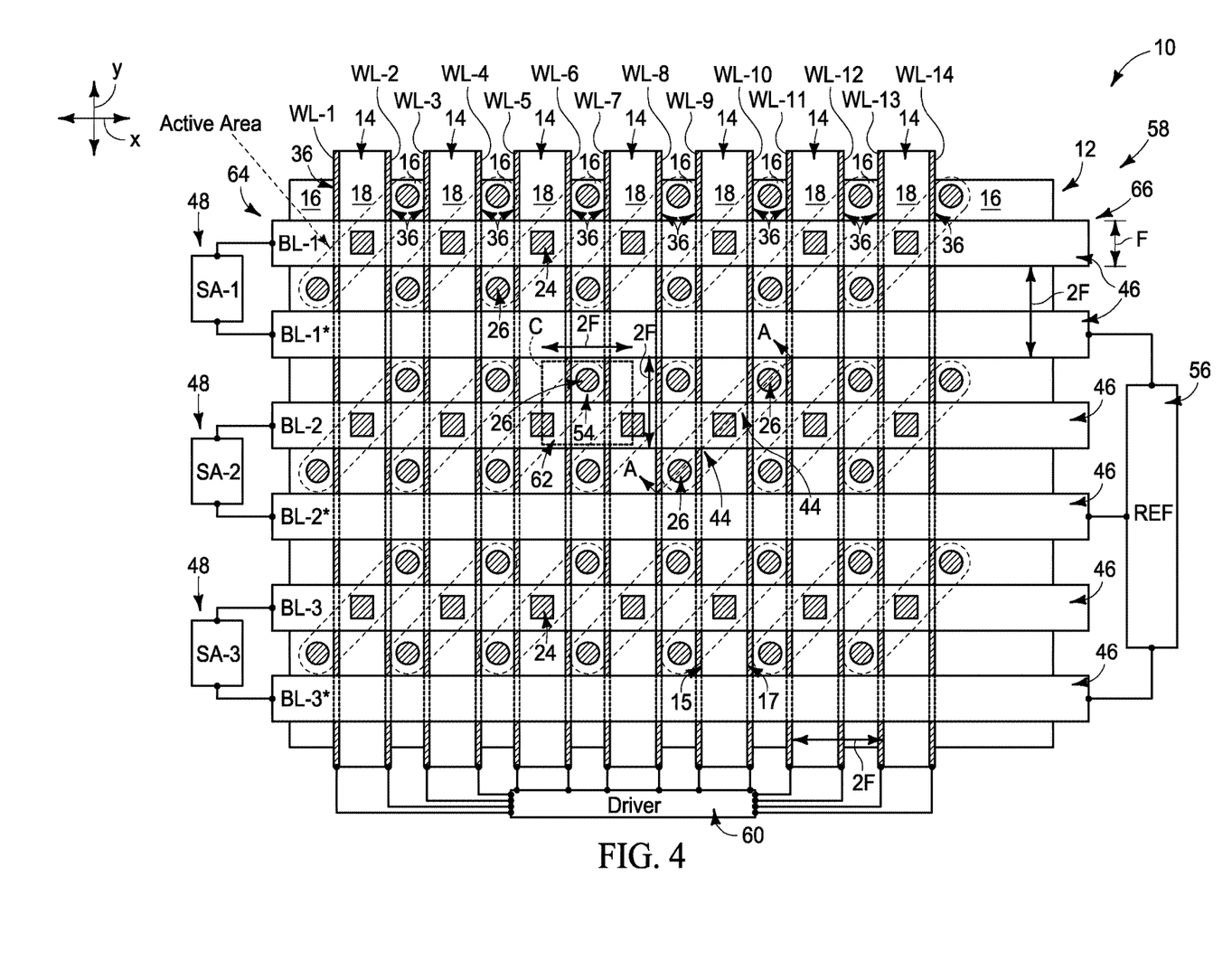
FIG. 4 is a diagrammatic top-down view of an example layout of a region of an example memory array.
Figure 5:
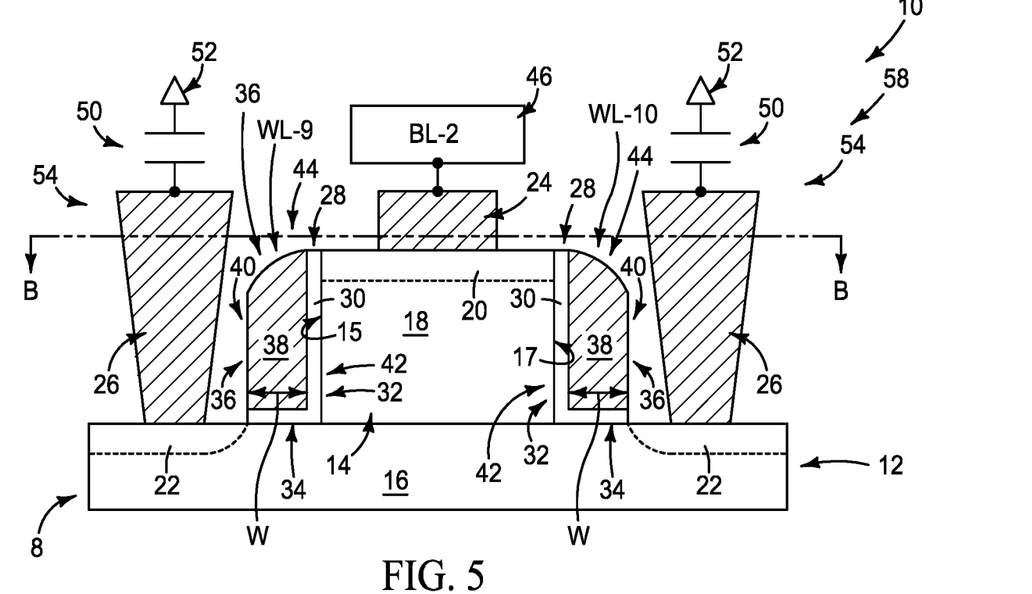
FIG. 5 is a diagrammatic cross-sectional side view of an example arrangement along the line A-A of FIG. 4.

Referring to FIGS. 4 and 5, such show a sectional top-down view (FIG. 4), and a sectional side view (FIG. 5) of a region of an example embodiment integrated assembly 10. The majority of the insulative materials which would generally be associated with the integrated assembly of FIGS. 4 and 5 are not shown in order to simplify the drawings. The section of FIG. 5 is generally along the line A-A of FIG. 4, and some of the illustrated features of FIG. 4 are along the line B-B of FIG. 5. The illustrations of FIGS. 4 and 5 are not drawn to scale relative to one another, but instead are utilized to diagrammatically illustrate representative features associated with the example assembly 10.

The assembly 10 includes a semiconductor base 12, and includes semiconductor features 14 projecting upwardly from the base. The base 12 is shown to comprise semiconductor material 16, and the semiconductor features 14 are shown to comprise semiconductor material 18. The semiconductor materials 16 and 18 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). The semiconductor materials 16 and 18 may be the same composition as one another, or may be different compositions relative to one another. In some embodiments, the semiconductor materials 16 and 18 may both comprise, consist essentially of, or consist of silicon.

The semiconductor features 14 and base 12 may be considered together to be a semiconductor substrate 8.

The semiconductor features 14 extend along a first direction corresponding to an illustrated y-axis direction. Although the semiconductor features 14 are shown to be straight, it is to be understood that in other embodiments such features may be curved, wavy, etc. Regardless, the semiconductor features 14 may be considered to generally extend along the illustrated y-axis direction.

Each of the semiconductor features 14 comprises a pair of opposing sidewalls 15 and 17 (only two of which are illustrated in the view of FIG. 4). The sidewalls 15 and 17 also extend along the illustrated y-axis direction.

First source/drain regions 20 are within upper portions of the semiconductor features 14 (with an example source/drain region 20 being shown in FIG. 5), and second source/drain regions 22 are within the semiconductor base 12 (with example source/drain regions 22 being shown in FIG. 5). Dashed lines utilized to diagrammatically illustrate approximate lower boundaries of the source/drain regions 20 and 22.

First electrical interconnects 24 are electrically coupled with the first source/drain regions 20, and second electrical interconnects 26 are electrically coupled with the second source/drain regions 22. Only some of the interconnects 24 and 26 are labeled in FIG. 4. The interconnects 24 are shown to be square in the top-down view of FIG. 4, and the interconnects 26 are shown to be circular. Such shapes of the interconnects 24 and 26 are chosen to assist the reader in distinguishing the interconnects 24 and 26 from one another. It is to be understood that the interconnects 24 and 26 may have any suitable shapes, and that in some embodiments the interconnects 24 and 26 may have the same shape as one another.

Dielectric structures 28 are along the opposing sidewalls 15 and 17 of the semiconductor features 14. Example dielectric structures 28 are shown in FIG. 5. The dielectric structures are not shown in the top-down view of FIG. 4 in order to simplify the drawing.

The dielectric structures 28 comprise dielectric material 30. Such dielectric material may comprise any suitable composition(s), and in some embodiments may comprise, consist essentially of, or consist of silicon dioxide. In some embodiments, the dielectric material 30 may be referred to as gate-dielectric-material.

The illustrated dielectric structures 30 are L-shaped. Specifically, the dielectric structures 30 have first segments (regions) 32 along the sidewall surfaces 15 and 17 of the semiconductor features 14, and have second segments (regions) 34 along the base 12. In the illustrated embodiment, the first segments 32 are vertically-extending segments (vertical legs), and the second segments 34 are horizontally-extending segments (horizontal legs), with the first segments 32 extending orthogonally (or at least substantially orthogonally) relative to the second segments 34. The term "substantially orthogonally" means orthogonally to within reasonable tolerances of fabrication and measurement. In other embodiments, the first and second segments 32 and 34 may extend along other directions than the illustrated directions, and may or may not be substantially orthogonal relative to one another. For instance, the sidewalls 15 and 17 may be tapered, rather than being the illustrated vertical sidewalls.

Conductive structures 36 are along the dielectric structures 28. The conductive structures 36 comprise conductive material 38. The conductive material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 38 may comprise one or more of tungsten, tungsten nitride, titanium nitride, etc.

The conductive structures 36 may be referred to as first conductive structures, and are shown to extend along the first direction (i.e., the illustrated y-axis direction). The conductive structures 36 may correspond to wordlines, and in the illustrated embodiment correspond to wordlines WL-1, WL-2, WL-3, WL-4, WL-5, WL-6, WL-7, WL-8, WL-9, WL-10, WL-11, WL-12, WL-13 and WL-14.

In some embodiments, the conductive structures 36 may be formed with deposition (e.g., atomic layer deposition, chemical vapor deposition, physical vapor deposition, etc.) followed by spacer-type etching. Accordingly, the conductive structures 36 may be advantageously formed to be very thin. For instance, in some embodiments the conductive structures 36 may have widths W (shown in FIG. 5) which are less than about 100 nanometers (nm), less than about 50 nm, etc. For instance, in some embodiments the conductive structures 36 may have widths W within a range of from about 2 nm to about 100 nm, within a range of from about 2 nm to about 50 nm, etc.

The first conductive structures 36 are over the second regions 34 of the dielectric structures 28 (as shown in FIG. 5), and are spaced from the semiconductor features 14 by at least the first regions 32 of the dielectric structures.

The first conductive structures 36 (i.e., the wordlines) include gating regions 40 (labeled in FIG. 5) which gatedly couple the first and second source/drain regions 20 and 22 with one another. Specifically, channel regions 42 are within the semiconductor materials of the base 12 and the features 14, and are between the source/drain regions 20 and 22. The gating regions 40 may be considered to be operatively adjacent to (operatively proximate to) the channel regions 42 such that a sufficient voltage applied to the gating regions will induce electric fields which enable current flow through the channel regions to electrically couple the source/drain regions 20 and 22 with one another. If the voltage along a wordline comprising a gating region is below a threshold level, the current will not flow through the channel region, and the source/drain regions on opposing sides of the channel region will not be electrically coupled with one another. The selective control of the coupling/decoupling of the source/drain regions through the level of voltage applied to a selected wordline may be referred to as gated coupling of the source/drain regions. The channel regions 42 may be referred to as depletion regions in some operational modes.

The wordlines 36 (e.g., WL-1) are shown to be coupled with wordline-driver-circuitry 60 (Driver). Such wordline-driver-circuitry may be utilized to provide desired voltage along the wordlines during the operation of the wordlines. The wordline-driver-circuitry 60 is configured to independently drive each of the wordlines 36, and in some embodiments may include separate drivers arranged in one-to-one relationship with the individual wordlines. It is to be understood that the illustrated wordlines are coupled to the illustrated wordline-driver-circuitry 60 in an arrangement which enables each of the wordlines to be independently operated relative to the other wordlines.

Transistors (access devices) 44 comprise the gating regions 40, the source/drain regions 20 and 22, and the channel regions 42, with a pair of example transistors 44 being labeled in the view of FIG. 5, and with such pair of example transistors 44 also being labeled in FIG. 4.

Second conductive structures 46 are over the semiconductor features 14, and extend along a second direction corresponding to the illustrated x-axis direction of FIG. 4. The second conductive structures 46 are shown to be straight, but in other embodiments may be curved, wavy, etc. Regardless, the second conductive structures may be considered to extend generally along the illustrated x-axis direction. The second conductive structures 46 extend along a second direction which crosses the first direction of the first conductive structures 14. In the shown embodiment, such second direction is substantially orthogonal to the first direction. In other embodiments, the second direction may not be substantially orthogonal to the first direction. The second conductive structures 46 are illustrated without cross-hatching in order to simplify the illustrations, even though cross-hatching is generally utilized to indicate conductive structures in the drawings provided herewith.

The second conductive structures 46 may correspond to digit-lines (bitlines, sense lines, etc.). The digit-lines alternate between true digit-lines (BL-1, BL-2 and BL-3) and complementary digit-lines (BL-1*, BL-2* and BL-3*). Sense-amplifier-circuitry 48 (indicated to include the sense amplifiers SA-1, SA-2 and SA-3) is provided adjacent the digit-lines. Each of the true digit-lines is comparatively coupled to one of the complementary digit-lines through the sense-amplifier-circuitry (e.g., BL-1 is comparatively coupled to BL-1* through the sense-amplifier-circuitry SA-1). For purposes of understanding this disclosure and the claims that follow, a first digit-line is "comparatively coupled" with a second digit-line through sense-amplifier-circuitry if the sense-amplifier-circuitry is configured to compare electrical properties (e.g., voltage) of the first and second digit-lines with one another. The terms "true" and "complementary" are arbitrary, and are used to differentiate the digit-lines which are compared to one another through sense-amplifier-circuitry.

In some embodiments, the true digit-lines (e.g., BL-1) may be considered to be a first set of the digit-lines, and the complementary digit-lines (e.g., BL-1*) may be considered to be a second set of the digit-lines. In the illustrated embodiment of FIG. 4, the digit-lines of the first set alternate with those of the second set along the y-axis direction. The digit-lines may be considered to be within a folded architecture. Specifically, the comparatively-coupled digit-lines (e.g., BL-1 and BL-1*) may be considered to fold across the sense amplifier between them (e.g., SA-1).

In the illustrated embodiment, the true digit-lines (e.g., BL-1) are over the interconnects 24, and are coupled with the first source/drain regions 20 through such interconnects. The interconnects 24 are diagrammatically illustrated in the top-down view of FIG. 4 to assist the reader in understanding the relationship between such interconnects and the digit-lines 46, even though the interconnects 24 would actually be hidden by the digit-lines 46 in an actual top-down view of the assembly 10.

The complementary digit-lines (e.g., BL-1*) are coupled to a reference-voltage-source 56 (REF). The reference-voltage-source may be at any suitable voltage, and in some embodiments may be at a voltage within a range of from greater than or equal to VSS to less than or equal to VCC.

The second interconnects 26 are coupled with storage-elements 50 (shown in FIG. 5). The storage-elements may be any suitable devices having at least two detectable states; and in some embodiments may be, for example, capacitors, resistive-memory devices, conductive-bridging devices, phase-change-memory (PCM) devices, programmable metallization cells (PMCs), etc. In the illustrated embodiment, the storage-elements 50 are capacitors. Each of the capacitors has one node coupled with an interconnect 26, and has another node coupled with a reference-voltage-source 52. The reference-voltage-source may be at any suitable reference voltage including, for example, ground, VCC/2, etc.

In operation, the storage-elements 50 may be incorporated within memory cells 54. In operation, a transistor 44 may be utilized to selectively couple the storage-element 52 of a memory cell 54 to an associated bitline 46 during read/write operations.

The memory cells 54 may be within a memory array 58. The reference-voltage-source 56 may be utilized to provide a static reference voltage (i.e., a substantially non-changing reference voltage) during operation of the memory cells of the memory array, or may be utilized to provide a dynamic reference voltage (i.e., a reference voltage which varies along some or all of the complementary digit-lines) during at least some operational modes of the memory cells of the memory array. There may be hundreds, millions, hundreds of millions, etc., of the memory cells within the memory array.

In the illustrated embodiment, the memory cells 54 are at approximately 45° angles across the gated channel regions, as shown in the top-down view of FIG. 4. In other embodiments, the memory cells may be formed at other suitable locations relative to the gated channel regions.

Active areas are diagrammatically illustrated in FIG. 4 with dashed-line ellipses. The active areas are tightly packed together to achieve desired high density of memory structures. Regions of adjacent (neighboring) active areas may be spaced from one another by one or more suitable insulative materials to alleviate undesired cross-talk between the adjacent active areas.

In some embodiments, the complementary digit-lines may be utilized to provide shielding between neighboring true digit-lines during one or more operational modes associated with the memory array 58 (e.g., the complementary digit-line BL-1* may be utilized to provide shielding between the true digit-lines BL-1 and BL-2). Such may alleviate, or even prevent, undesired cross-talk between the neighboring true digit-lines. In some embodiments, the folded architecture of FIG. 4 enables both a true digit-line (e.g., BL-1) and a complementary digit-line (e.g., BL-1*) to be equally impacted by the same noise (so-called common mode noise), so that such noise self-cancels within the true and complementary digit-lines to improve signal-to-noise relative to non-folded architectures.

In some embodiments, the true digit-lines (e.g., BL-1) may be considered to be EVEN digit-lines which are coupled with the wordlines 36 (i.e., which have channel regions gatedly controlled by regions of the wordlines 36), while the complementary digit-lines (e.g., BL-1*) may be considered to be ODD digit-lines which are not coupled with the wordlines 36 (i.e., which do not have channel regions gatedly controlled by regions of the wordlines 36). Accordingly, strobing of the wordlines only strobes half of the digit-lines (specifically, only strobes the EVEN digit-lines), while the other half the digit-lines (the ODD digit-lines) remain at a reference voltage to provide shielding between the strobed digit-lines. The non-strobed digit-lines (the complementary digit-lines) are comparatively coupled with the strobed digit-lines (the true digit-lines) through the sense amplifiers 48.

In some embodiments, the memory array 58 may be considered to comprise unit cells 62, with an example unit cell being within a region C bounded by an illustrated dashed-line in FIG. 4. The unit cell 62 includes one of the interconnects 26. In some embodiments, the digit-lines 46 may be fabricated with a lithographic process (e.g., a photolithographic process) having a minimum feature size, F, associated therewith. The digit-lines 46 are thus on a pitch of 2F. In some embodiments, the semiconductor features 14 may be fabricated to be on the same 2F-pitch, as shown. The unit cell 62 may have an area of no greater than $4F^2$, which may advantageously enable the unit cells to be tightly-packed, thereby conserving valuable semiconductor real estate.

In some applications, the small unit cells 62, together with the low signal-to-noise achievable with the illustrated folded architecture, may enable increased performance, including, for example, faster reading, more effective signal sensing, etc.; which may also enable a higher yield of memory from a fabrication process and/or a better performing memory chip as compared to memory chips having conventional architecture.

The illustrated embodiment of FIG. 4 shows the digit-lines 46 extending along the x-axis direction and having opposing first ends 64 and second ends 66. The sense amplifiers 48 are laterally offset from the first ends 64 of the digit-lines 46, and the reference-voltage-source 56 is laterally offset from the second ends 66 of the digit-lines 46. In other embodiments, the sense amplifiers 48 and/or reference-voltage-source 56 may be provided in one or more other locations, including, for example, under the memory array 58, over the memory array 58, etc.

Figure 6:
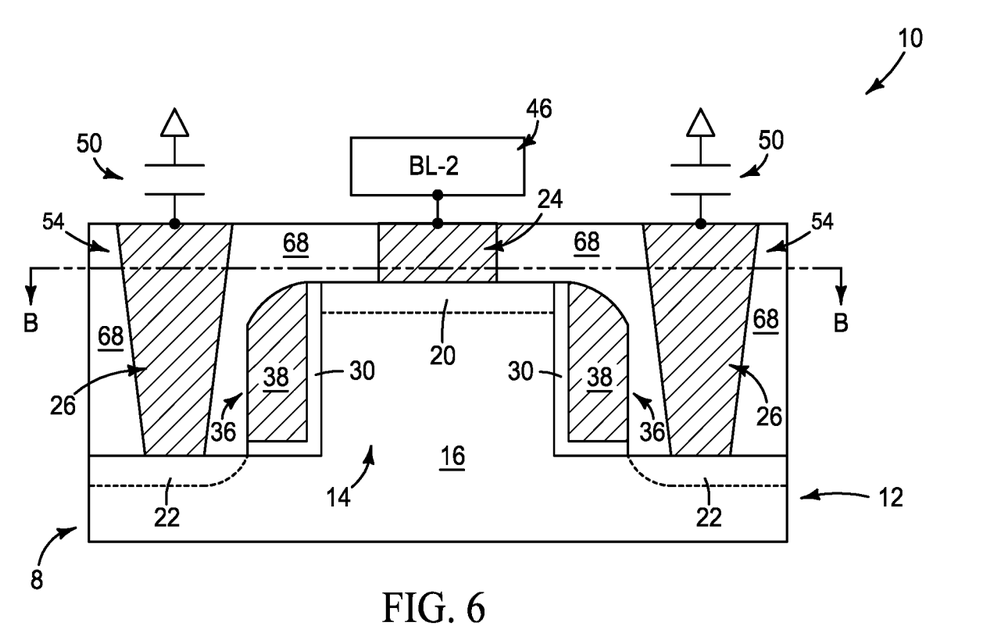
FIG. 6 is a diagrammatic cross-sectional side view of another example arrangement along the line A-A of FIG. 4.

FIG. 6 shows a region of the integrated assembly 10 analogous to that of FIG. 5, but shows the base 12 and the feature 14 comprising a common semiconductor material 16. Such semiconductor material may be any of the semiconductor materials described above, and in some embodiments may comprise, consist essentially of, or consist of one or both of silicon and germanium. The semiconductor material may be in any suitable crystalline form, and in some embodiments may be monocrystalline. Also, FIG. 6 shows insulative material 68 extending over and between the conductive structures 24, 26 and 36. The insulative material 68 may also extend over between the digit-lines 46. The insulative material 68 may comprise any suitable composition(s), and in some embodiments may comprise one or more of silicon dioxide, silicon nitride, aluminum oxide, etc. In some applications, the insulative material 68 may be utilized, at least in part, to avoid having current leaking between adjacent memory cells 54.

Figure 7:
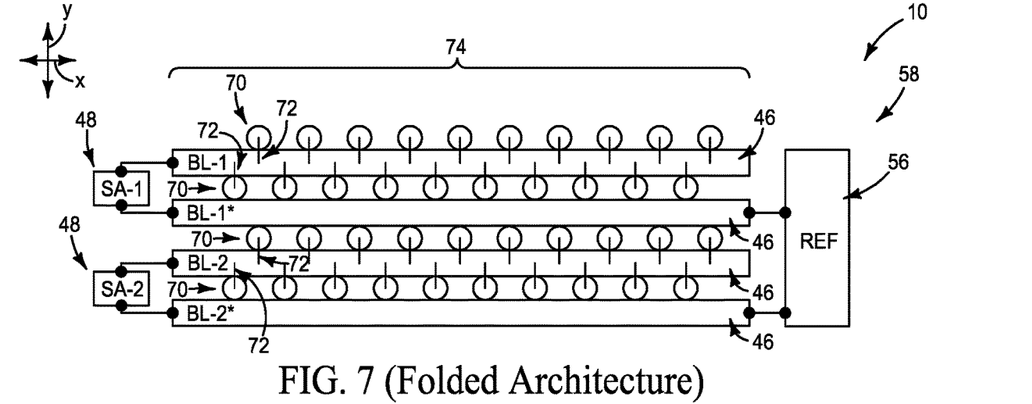
FIGS. 7-9 are diagrammatic plan views of example regions of example memory arrays.

FIG. 7 shows another diagrammatic representation of a region of the integrated assembly 10 of FIG. 4 having the folded digit-line architecture. FIG. 7 shows the digit-lines 46, with such digit-lines being subdivided amongst a first set comprising the true digit-lines BL-1 and BL-2, and a second set comprising the complementary digit-lines BL-1* and BL-2*. The true digit-lines are in paired relationships with the complementary digit-lines, with each of the true digit-lines being comparatively coupled to one of the complementary digit-lines through a sense amplifier 48.

The complementary digit-lines BL-1* and BL-2* are electrically coupled with the reference-voltage-source 56.

Memory devices 70 (only some of which are labeled) are coupled with the true digit-lines BL-1 and BL-2, with such coupling being diagrammatically illustrated with stems 72 (only some of which are labeled). The memory devices may include the interconnects 26 and the storage elements 50 (e.g., capacitors) described above with reference to FIGS. 4 and 5. The wordlines 36 (e.g., WL-1) of FIGS. 4 and 5 are not shown in FIG. 7 in order to simplify the drawing. The memory devices 70 may be considered to be comprised by memory cells. Accordingly, the embodiment of FIG. 7 may be considered to comprise memory cells associated with the true digit-lines, and to not comprise memory cells associated with the complementary digit-lines.

The folded architecture of FIG. 7 is identical to that described above with reference to FIG. 4. Such folded architecture comprises the true and complementary digit-lines extending along the illustrated x-axis direction, and alternating with one another along the illustrated y-axis direction. In some embodiments, the configuration of FIG. 7 may be considered to comprise the true and complementary digit-lines within a single memory mat 74.

Figure 8:
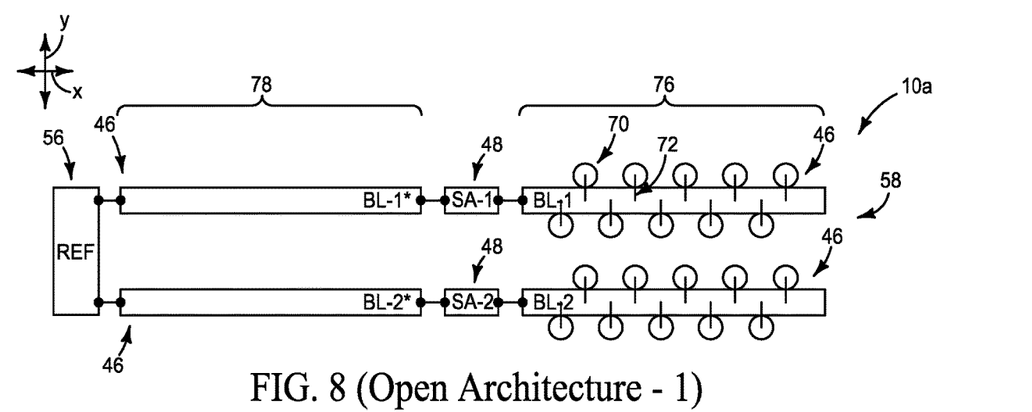

FIG. 8 shows an alternative configuration relative to that of FIG. 7, and specifically shows a region of an example integrated assembly 10a. The configuration of FIG. 8 has the complementary digit-lines BL-1* and BL-2* laterally offset from the true digit-lines BL-1 and BL-2 in an open architecture. Specifically, the digit-lines 46 extend along the illustrated x-axis direction, and the complementary digit-lines are offset from the true digit-lines along the x-axis direction. The memory devices 70 are associated with the true digit-lines (BL-1 and BL-2), and accordingly the true digit-lines are incorporated into the memory array 58. In contrast, no memory cells are associated with the complementary digit-lines (BL-1* and BL-2*), and instead the complementary digit-lines are coupled with the reference-voltage-source 56.

The configuration of FIG. 8 may be considered to comprise a pair of memory mats 76 and 78, with the memory mat 76 comprising the true digit-lines and the memory mat 78 comprising the complementary digit-lines.

Figure 9:
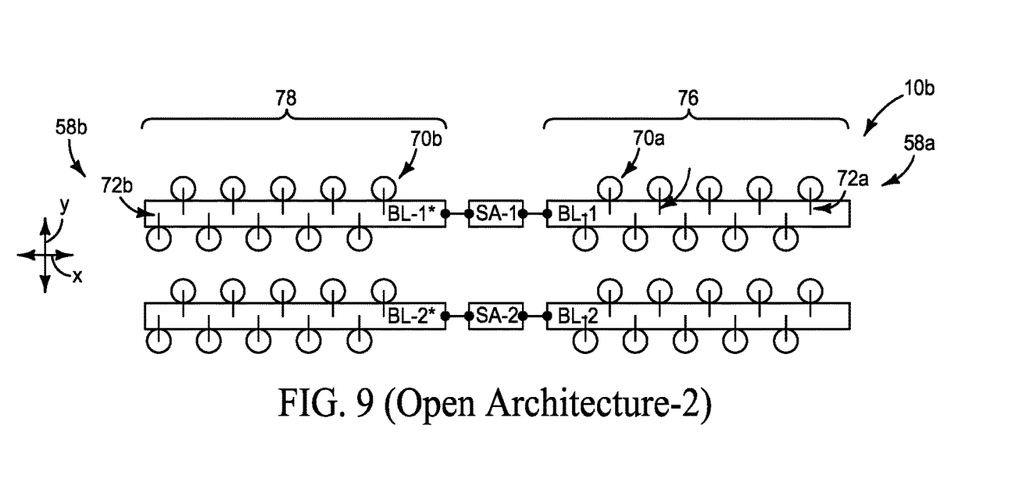

FIG. 9 shows another example configuration of an open architecture, and specifically shows a region of an example integrated assembly 10b. The configuration of FIG. 9 has first memory devices 70a associated with the true digit-lines (e.g., BL-1), and has second memory devices 70b associated with the complementary digit-lines (e.g., BL-1*). The second memory devices 70b may be substantially identical to the first memory devices 70a, with the term "substantially identical" meaning identical to within reasonable tolerances of fabrication and measurement.

The first memory devices 70a are within a first memory array 58a within the memory mat 76, and the second memory devices 70b are within a second memory array 58b within the memory mat 78. In some embodiments, the embodiment of FIG. 9 may be considered to comprise first memory cells associated with the true digit-lines, and to comprise second memory cells associated with the complementary digit-lines.

The folded architecture exemplified by the embodiment of FIG. 7 may be advantageous over the open architectures exemplified by the embodiments of FIGS. 8 and 9 in that the complementary digit-lines within the folded architecture may provide shielding between neighboring true digit-lines. However, there may be applications in which an open architecture is desired due to, for example, constraints imposed during fabrication, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow. The terms "couple, coupling, coupled, etc." may refer to electrical connections.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a set of true digit-lines and a set of complementary digit-lines. Each of the complementary digit-lines is comparatively coupled with an associated one of the true digit-lines. A semiconductor substrate is under the true digit-lines. The semiconductor substrate includes semiconductor features which project upwardly from a semiconductor base and which extend along a first direction. Each of the semiconductor features has opposing sidewalls. First source/drain regions are within the semiconductor features and second source/drain regions are within the semiconductor base. The true digit-lines extend along a second direction which crosses the first direction. The true digit-lines are coupled with the first source/drain regions. Wordlines are along the opposing sidewalls and include gating regions which gatedly couple the first source/drain regions with the second source/drain regions. Storage-elements are coupled with the second source/drain regions. The storage-elements are included within memory cells.

Some embodiments include an integrated assembly having semiconductor features which project upwardly from a semiconductor base and which extend along a first direction. Each of the semiconductor features has opposing sidewalls. First source/drain regions are within upper portions of the semiconductor features. Second source/drain regions are within the base. Dielectric structures are along the opposing sidewalls of the semiconductor features. The dielectric structures have first regions along the opposing sidewalls and have second regions along the base. First conductive structures are along the dielectric structures. The first conductive structures are over the second regions of the dielectric structures and are spaced from the semiconductor features by at least the first regions of the dielectric structures. The first conductive structures extend along the first direction. The first conductive structures include gating regions which gatedly couple the first and second source/drain regions with one another. Second conductive structures are over the semiconductor features and extend along a second direction which crosses the first direction. The second conductive structures alternate between true and complementary second conductive structures. The true second conductive structures are coupled with the first source/drain regions. The complementary second conductive structures are comparatively coupled with the true second conductive structures. Storage-elements are coupled with the second source/drain regions.

Some embodiments include an integrated assembly having a set of true digit-lines and a set of complementary digit-lines. Each of the complementary digit-lines is comparatively coupled with an associated one of the true digit-lines. A semiconductor substrate is under the true and complementary digit-lines. The semiconductor substrate includes semiconductor features which project upwardly from a semiconductor base and which extend along a first direction. Each of the semiconductor features has opposing sidewalls. First source/drain regions are within the semiconductor features and second source/drain regions are within the semiconductor base. The true and complementary digit-lines extend along a second direction which crosses the first direction, and alternate with one another along the first direction. The true digit-lines are coupled with the first source/drain regions. Wordlines are along the opposing sidewalls and include gating regions which gatedly couple the first source/drain regions with the second source/drain regions. Storage-elements are coupled with the second source/drain regions and are included within memory cells. The complementary digit-lines are coupled with a reference-voltage-source.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
    a set of true digit-lines and a set of complementary digit-lines; each of the complementary digit-lines being comparatively coupled with an associated one of the true digit-lines;
    a semiconductor substrate under the true digit-lines; the semiconductor substrate including semiconductor features projecting upwardly from a semiconductor base and extending along a first direction; each of the semiconductor features having opposing sidewalls; first source/drain regions being within the semiconductor features and second source/drain regions being within the semiconductor base;
    the true digit-lines extending along a second direction which crosses the first direction;
    the true digit-lines being coupled with the first source/drain regions;
    wordlines along the opposing sidewalls and including gating regions which gatedly couple the first source/drain regions with the second source/drain regions; and
    storage-elements coupled with the second source/drain regions; the storage-elements being included within memory cells.

2. The integrated assembly of claim 1 wherein the complementary digit-lines alternate with the true digit-lines in a folded architecture.

3. The integrated assembly of claim 2 wherein the complementary digit-lines are coupled with a reference-voltage-source.

4. The integrated assembly of claim 1 wherein the complementary digit-lines are laterally offset from the true digit-lines in an open architecture.

5. The integrated assembly of claim 4 wherein the memory cells are first memory cells associated with the true digit-lines, and further comprising second memory cells associated with the complementary digit-lines.

6. The integrated assembly of claim 4 wherein the complementary digit-lines are coupled with a reference-voltage-source.

7. The integrated assembly of claim 1 wherein the second direction is orthogonal to the first direction.

8. The integrated assembly of claim 1 wherein the storage-elements are capacitors.

9. An integrated assembly, comprising:
    semiconductor features projecting upwardly from a semiconductor base and extending along a first direction; each of the semiconductor features having opposing sidewalls;
    first source/drain regions within upper portions of the semiconductor features;
    second source/drain regions within the base;
    dielectric structures along the opposing sidewalls of the semiconductor features, the dielectric structures having first regions along the opposing sidewalls and second regions along the base;
    first conductive structures along the dielectric structures; the first conductive structures being over the second regions of the dielectric structures and being spaced from the semiconductor features by at least the first regions of the dielectric structures, the first conductive structures extending along the first direction; the first conductive structures including gating regions which gatedly couple the first and second source/drain regions with one another;
    second conductive structures over the semiconductor features and extending along a second direction which crosses the first direction; the second conductive structures alternating between true and complementary second conductive structures; the true second conductive structures being coupled with the first source/drain regions; the complementary second conductive structures being comparatively coupled with the true second conductive structures; and
    storage-elements coupled with the second source/drain regions.

10. The integrated assembly of claim 9 wherein the semiconductor features and the semiconductor base comprise a same semiconductor composition as one another.

11. The integrated assembly of claim 10 wherein the semiconductor features and the semiconductor base comprise silicon.

12. The integrated assembly of claim 9 wherein the semiconductor features and the semiconductor base comprise different semiconductor compositions relative to one another.

13. The integrated assembly of claim 9 wherein the dielectric structures comprise silicon dioxide.

14. The integrated assembly of claim 9 wherein the first conductive structures comprise widths within a range of from about 2 nm to about 100 nm.

15. The integrated assembly of claim 9 wherein the first conductive structures comprise widths within a range of from about 2 nm to about 50 nm.

16. The integrated assembly of claim 9 wherein the first conductive structures are wordlines and are coupled with wordline-driver-circuitry.

17. The integrated assembly of claim 9 wherein the second conductive structures are digit-lines, and wherein the comparative coupling utilizes sense-amplifier-circuitry coupling the true digit-lines with the complementary digit-lines.

18. The integrated assembly of claim 9 wherein the complementary second conductive structures are coupled with a reference-voltage-source.

19. The integrated assembly of claim 18 wherein the storage-elements are included within memory cells of a memory array; and wherein the reference-voltage-source provides a static reference voltage during operation of the memory array.

20. The integrated assembly of claim 18 wherein the storage-elements are included within memory cells of a memory array; and wherein the reference-voltage-source provides a dynamic reference voltage during operation of the memory array.

21. The integrated assembly of claim 9 wherein the storage-elements are capacitors.

22. The integrated assembly of claim 21 wherein the capacitors are coupled to the second source/drain regions through conductive interconnects.

23. The integrated assembly of claim 22 wherein the second conductive structures are fabricated with a lithographic process having a minimum feature size, F, associated therewith; wherein the conductive interconnects are within unit cells of a memory array; and wherein each unit cell has an area no greater than about $4F^2$.

24. An integrated assembly, comprising:
    a set of true digit-lines and a set of complementary digit-lines; each of the complementary digit-lines being comparatively coupled with an associated one of the true digit-lines;
    a semiconductor substrate under the true and complementary digit-lines; the semiconductor substrate including semiconductor features projecting upwardly from a semiconductor base and extending along a first direction; each of the semiconductor features having opposing sidewalls; first source/drain regions being within the semiconductor features and second source/drain regions being within the semiconductor base;

the true and complementary digit-lines extending along a second direction which crosses the first direction, and alternating with one another along the first direction; the true digit-lines being coupled with the first source/drain regions;

wordlines along the opposing sidewalls and including gating regions which gatedly couple the first source/drain regions with the second source/drain regions;

storage-elements coupled with the second source/drain regions and being included within memory cells; and the complementary digit-lines being coupled with a reference-voltage-source.

25. The integrated assembly of claim 24 comprising sense-amplifier-circuitry configured to provide the comparative coupling of the true and complementary digit-lines; wherein the sense-amplifier-circuitry is laterally offset from first ends of the true and complementary digit-lines; and wherein the reference-voltage-source is laterally offset from second ends of the complementary digit-lines, with the second ends being in opposing relation to the first ends.

26. The integrated assembly of claim 24 wherein the memory cells are included within a memory array; wherein the storage-elements are coupled to the second source/drain regions through conductive interconnects; wherein the true and complementary digit-lines are fabricated with a lithographic process having a minimum feature size, F, associated therewith; wherein the conductive interconnects are within unit cells of the memory array; and wherein each unit cell has an area no greater than about $4F^2$.

27. The integrated assembly of claim 24 wherein the wordlines are spaced from the semiconductor substrate by gate-dielectric-material.

28. The integrated assembly of claim 27 wherein the gate-dielectric-material is configured as L-shaped structures, with vertical legs of the L-shaped structures being along the semiconductor features, and with horizontal legs of the L-shaped structures being along the semiconductor base.

29. The integrated assembly of claim 28 wherein the gate-dielectric-material comprises silicon dioxide.

30. The integrated assembly of claim 24 wherein the complementary digit-lines are configured to provide shielding between the true digit-lines in a folded digit-line-architecture.

31. The integrated assembly of claim 24 wherein the storage-elements are capacitors.

32. The integrated assembly of claim 24 wherein the reference-voltage-source provides a voltage within a range of from greater than or equal to VSS to less than or equal to VCC.

* * * * *